(12) United States Patent
Sakamoto et al.

(10) Patent No.: US 7,075,115 B2
(45) Date of Patent: Jul. 11, 2006

(54) LIGHT-EMITTING DIODE

(75) Inventors: Takahiko Sakamoto, Anan (JP); Takeshi Kususe, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/674,539

(22) Filed: Oct. 1, 2003

(65) Prior Publication Data

US 2004/0124422 A1    Jul. 1, 2004

(30) Foreign Application Priority Data

| Oct. 3, 2002 | (JP) | ............................ 2002/291131 |
| Nov. 7, 2002 | (JP) | ............................ 2002/324020 |
| Dec. 24, 2002 | (JP) | ............................ 2002/372034 |
| Aug. 20, 2003 | (JP) | ............................ 2003/296275 |

(51) Int. Cl.
 *H01L 33/00*   (2006.01)

(52) U.S. Cl. ........................................................ 257/98

(58) Field of Classification Search ................ 257/80, 257/81, 82, 83, 72, 79, 99, 94, 95, 96; 438/22, 438/24
See application file for complete search history.

(56) References Cited

U.S. PATENT DOCUMENTS

| 6,809,340 B1 * | 10/2004 | Kato et al. ..................... 257/79 |
| 2001/0048113 A1 * | 12/2001 | Kim ............................. 257/98 |
| 2002/0047128 A1 * | 4/2002 | Song et al. ................... 257/82 |

FOREIGN PATENT DOCUMENTS

| JP | 10-173230 | 6/1998 |
| JP | 2000-164930 | 6/2000 |
| JP | 2000/164930 | 6/2000 |
| JP | 2000-174339 | 6/2000 |
| JP | 2000-216431 | 8/2000 |
| JP | 2001-24222 | 1/2001 |
| JP | 2001-345480 | 12/2001 |
| JP | 2002-94118 | 3/2002 |
| JP | 2002-118288 | 4/2002 |
| JP | 2003-524295 | 8/2003 |
| WO | 01/41219 | 6/2001 |
| WO | 01/41223 | 6/2001 |

\* cited by examiner

*Primary Examiner*—Long Pham
*Assistant Examiner*—Dana Farahani
(74) *Attorney, Agent, or Firm*—Wenderoth, Lind & Ponack, L.L.P.

(57) ABSTRACT

A light-emitting diode capable of making its light emission more uniform without too high a concentration current and of improving the efficiency of outgoing light and its life. In the light-emitting diode, the n-side electrode has an n-side connecting portion and an n-side extending portion, which extends in the longitudinal direction from a predetermined part of the n-side connecting portion, and the p-side pad member has at least a p-side connecting portion to be connected to a conductive member. The light-emitting diode further includes an n-side connecting area, in which the n-side connecting portion is provided, provided in proximity to one end in the longitudinal direction, a p-side connecting area, in which the p-side connecting portion is provided, provided in proximity to another end in the longitudinal direction, and a middle area provided between them, and the n-side extending portion is positioned in the middle area, and extends so as to be opposed to the p-side current diffusing member.

6 Claims, 9 Drawing Sheets

LIGHT-EMITTING DIODE

This application is based on applications No. 2002-291131 filed in Japan on Oct. 3, 2002, No. 2002-324020 filed in Japan on Nov. 7, 2002, No. 2002-372034 filed in Japan on Dec. 24, 2002, and No. 2003-296275 filed in Japan on Aug. 20, 2003, the contents of which are incorporated hereinto by reference.

BACKGROUND OF THE INVENTION

1. Technical Field

The present invention relates to a light-emitting diode with layer construction of nitride semiconductor ($In_X Al_Y Ga_{1-X-Y}N$, $0 \leq X$, $0 \leq Y$, $X+Y \leq 1$), especially, first to a light-emitting diode capable of making its light emission uniform and of improving its life, and secondly to a light-emitting diode capable of improving light outgoing toward the observation side.

2. Description of Related Art

A light-emitting diode with the layer construction of nitride semiconductor is widely used as a high-luminance pure green LED, blue LED in various fields such as a full color LED display, a traffic light, and a backlight.

Generally, these LEDs have layer construction, in which an n-type nitride semiconductor layer, an active layer, and a p-type nitride semiconductor layer are successively laminated on or above a substrate such as sapphire. Further, a p-side electrode is provided on the p-type nitride semiconductor layer, and an n-side electrode is provided on the n-type nitride semiconductor layer. For example, when the p-side electrode and the n-side electrode are provided in the same plane side, the p-side electrode is positioned on the p-type nitride semiconductor layer, and the n side electrode is positioned on an exposed n-type nitride semiconductor layer, which is formed by removing a part of the p-type nitride semiconductor layer, active layer, and n-type nitride semiconductor layer by etching etc. Furthermore, in order to supply a current, a conductive member such as a gold wire or various materials of solder is connected to each electrode. Various electrode arrangements of such an LED have been proposed (see reference 1, for example). Moreover, in order to improve light outgoing, various kinds of LED construction are proposed (see reference 2, for example).

However, it is not easy to make light-emission wide and uniform in an LED, even though the p-side current diffusing member is provided in the p-side electrode. That is a first problem. On the other hand, when each electrode is deformed or enlarged in order to make light-emission wide, this causes too high a concentration current area. Consequently, this causes not only insufficient efficiency of light-emission efficiency but also reduction of the life.

Furthermore, when an opening portion is provided in an area which is usually a light-emission area in order to improve light-emitting efficiency, this reduces device characteristics such as high LED resistance. That is a second problem.

Reference 1: Japanese Laid-Open Publication Kokai No. 2000-164930

Reference 2: International Publication number WO01/41219

SUMMARY OF THE INVENTION

The present invention is devised to solve the above problems. It is a first object of the present invention to provide a long-life light-emitting diode capable of making its light emission more uniform without too high a concentration current and of improving efficiency of light outgoing by specifying a shape and a position of an electrode. Furthermore, it is a second object of the present invention to improve efficiency of light outgoing toward the observation side by use of the area, which is not usually a light-emission area.

A light-emitting diode according to the present invention comprises an n-type nitride semiconductor layer; an n-type nitride semiconductor layer; an n-side electrode, which is provided on the n-type nitride semiconductor layer; a p-type nitride semiconductor layer; and a p-side electrode, which is provided on the p-type nitride semiconductor layer, having a p-side current diffusing member and a p-side pad member provided on at least a part of the p-side current diffusing member. The n-side electrode and p-side electrode are provided in an electrode-forming-plane side, and the light-emitting diode has a shape with a longitudinal direction in view from the electrode-forming-plane side, and the n-side electrode has an n-side connecting portion to be connected to a conductive member, and an n-side extending portion which extends in the longitudinal direction from a predetermined part of the n-side connecting portion, and the p-side pad member has at least a p-side connecting portion to be connected to a conductive member, and the light-emitting diode further comprises an n-side connecting area, in which the n-side connecting portion is provided, provided in proximity to one end in the longitudinal direction, a p-side connecting area, in which the p-side connecting portion is provided, provided in proximity to another end in the longitudinal direction, and a middle area provided between them, and the n-side extending portion is positioned in the middle area, and extends so as to be opposed to the p-side current diffusing member.

In addition, the p-side pad member further has a p-side extending portion, which extends in the longitudinal direction from a predetermined part of the p-side connecting portion, and the p-side extending portion is opposed to the n-side extending portion in the middle area, and is positioned in the far side from the n-side extending portion in the p-side current diffusing member.

In addition, the p-side current diffusing member allows at least a part of the light from the light-emitting diode to pass through.

In addition, the p-side current diffusing member has a plurality of openings, which allows at least a part of the light from the light-emitting diode to pass through.

In addition, the p-side current diffusing member has a stair portion in a predetermined part of the middle area, and the n-side extending portion extends along the stair portion, and the distance D between the n-side extending portion and the far-side edge of the p-side current diffusing member from the n-side extending portion in the middle area is shorter than the distance E, which is the width of the p-side current diffusing member in the p-side connecting area in the width direction.

In addition, the distance A between the n-side extending portion and the p-side current diffusing member, which are opposed to each other, is shorter than the distance B between the tip of the n-side extending portion and the p-side current diffusing member positioned in the p-side connecting area side from the tip.

In addition, the n-side connecting portion and the p-side current diffusing member are opposed to each other in the longitudinal direction, and the distance A between the n-side extending portion and the p-side current diffusing member, which are opposed to each other, is shorter than at least the distance C between the n-side connecting portion and the p-side current diffusing member, which are opposed to each other, in the longitudinal direction in proximity to the tip of the p-side extending portion.

Moreover, the n-side connecting portion and the p-side connecting portion are opposed to each other in the longitudinal direction.

A light-emitting diode according to the present invention comprises a laminated-layer construction of semiconductor having an n-type contact layer of nitride semiconductor with an n-side electrode, a p-type contact layer of nitride semiconductor with a p-side electrode, and an active layer of nitride semiconductor interposed between the n-type contact layer and p-type contact layer, wherein, the n-side electrode and the p-side electrode are provided in the same electrode-forming-plane side, and the n-type contact layer has a first area where the laminated-layer construction of semiconductor with the p-side electrode is provided, and a second area different from the first area, in view from the electrode-forming-plane side, and a plurality of bumps and dips is formed in the second area, and the top of the plurality of bumps and dips is positioned in the p-type contact layer side than the active layer in a cross-sectional view of the light-emitting diode.

In addition, the top of the plurality of bumps and dips is positioned virtually as high as the p-type contact layer.

In addition, the bumps are formed in a trapezoid, which is gradually thinner toward the p-type contact layer side in view of a cross-sectional view of the bumps and dips.

In addition, the plurality of bumps and dips is provided at least between the first area and the n-side electrode in view from the electrode-forming-plane side.

In addition, the p-side electrode has a p-side current diffusing member, which is provided on the p-type contact layer, for diffusing a current supplied thereto, and a pad member, which is provided at least on a part of the p-side current diffusing member, for supplying a current to the p-side current diffusing member, and the laminated-layer construction of semiconductor provided in the first area, which is positioned between the n-side electrode and the pad member of the p-side electrode, has constricted portions in the both sides in the direction perpendicular to the line connecting the n-side electrode and the pad member of the p-side electrode in view from the electrode-forming-plane side, and the plurality of bumps and dips is formed in the constricted portions.

Moreover, the p-side electrode has a p-side current diffusing member, which is provided on the p-type contact layer, for diffusing a current supplied thereto, and a pad member, which is provided at least on a part of the p-side current diffusing member, for supplying a current to the p-side current diffusing member, and the laminated-layer construction of semiconductor provided in the first area, which is positioned between the n-side electrode and the pad member of the p-side electrode, has a portion constricted from the n-side electrode along the line connecting the n-side electrode and the pad member of the p-side electrode in view from the electrode-forming-plane side, and the plurality of bumps and dips is formed in the constricted portion.

According to a light-emitting diode of the present invention, it is possible to make its light emission more uniform without too high a concentration current and to improve efficiency of light outgoing and its life.

Furthermore, it is possible to effectively perform control of efficiency of light outgoing and of light directivity, and to improve its performance as a light-emitting device.

DETAILED DESCRIPTION OF THE PREFERED EMBODIMENTS

Figure 1:
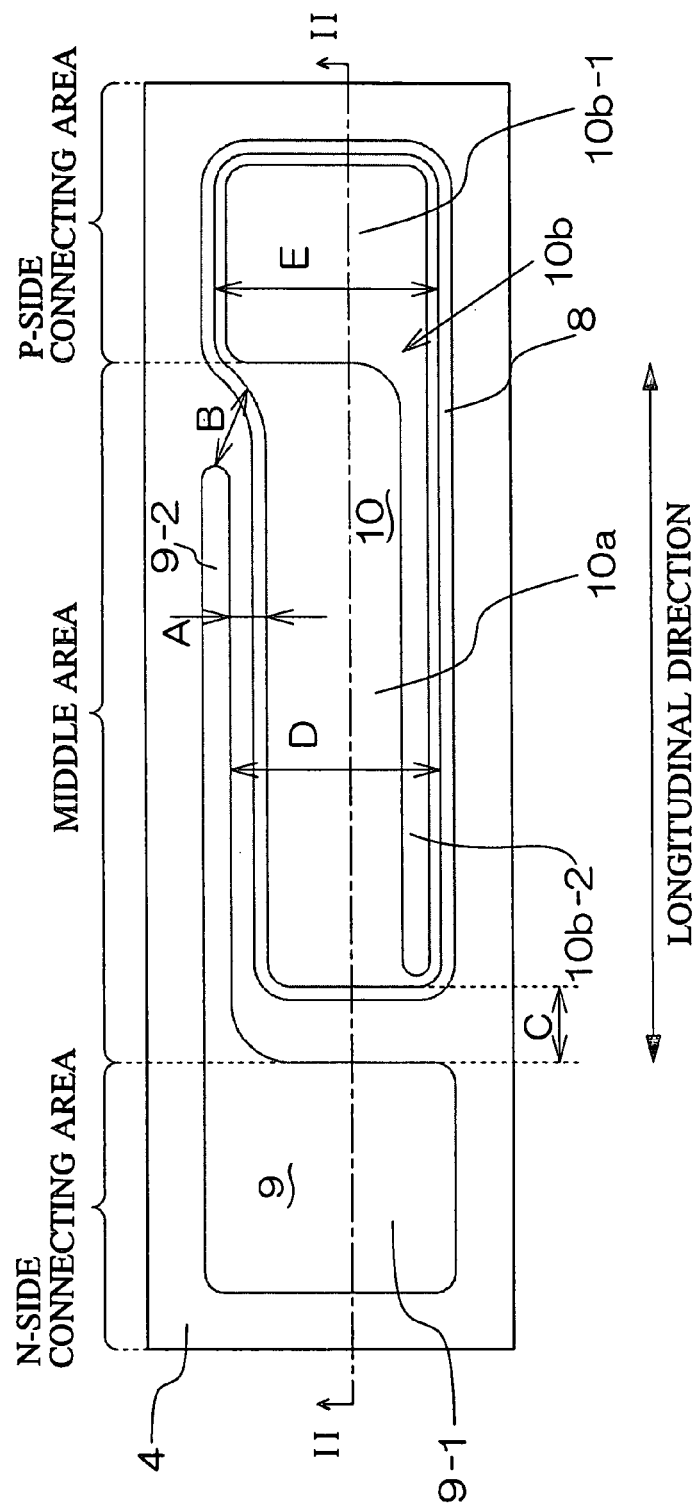
FIG. 1 is a plan view of an LED of a first embodiment according to the present invention from an electrode-forming-plane side.

Various kinds of nitride semiconductors can be used for each semiconductor layer in a light-emitting diode (hereinafter occasionally refer to an "LED") according to the present invention. Specifically, two or more kinds of semiconductors such as $In_XAl_YGa_{1-X-Y}N$ ($0 \leq X$, $0 \leq Y$, $X+Y \leq 1$), which is formed by the organic-metal vapor-phase-epitaxy method (MOCVD), a hydride vapor-phase-epitaxy method (HVPE), etc are preferably used. In addition, MIS junction structure, homostructure, heterostructure, or double heterostructure with PIN junction, or PN junction can be applied to layer construction. Additionally, any of the layers can be formed in superlattice structure. Moreover, an active layer can be single quantum-well-structure or multi-quantum-well-structure, in which a thin layer with quantum effect is formed.

Generally, each semiconductor layer is formed on a particular substrate in an LED. When an insulating substrate such as sapphire is used and is not removed in the whole process, both a p-side electrode and an n-side electrode are usually formed on the semiconductor layers in the same plane side. In this case, face-up mounting, in which the semiconductor layer side is positioned toward the observation side to allow the emitted light to go out through the semiconductor layer side, can be used. Face-down mounting, in which the substrate side is positioned toward the observation side to allow the emitted light to go out through the substrate side, can be also used. Needless to say, after removing the substrate in the process, face-up mounting or face-down mounting can be used. In addition, the substrate is not specifically limited to sapphire but can be known materials, such as spinel, SiC, GaN, and GaAs.

The following description will describe the embodiments according to the present invention with reference to the drawings. It should be appreciated, however, that the embodiment described below is an illustration of a light-emitting diode to give a concrete form to technical ideas of the invention, and a light-emitting diode according to the present invention are not specifically limited to description below.

In addition, it should be appreciated that members in the claims are not specifically limited to the members in the embodiments of this specification. Especially, dimensions, materials, shapes, relative arrangement, or the like are merely illustrations for explanation, and the scope of the present invention is not only limited to them as long as no specific mention is made. Additionally, the sizes and the arrangement relationships of the members in each of drawings are occasionally shown larger for ease of explanation. Furthermore, in the description below, the same designation, or the same reference signs show the same member or the equivalent member, so that the detailed explanation is omitted as a matter of convenience. Moreover, while two or more elements can be commonly composed of the same material, so that one member can play the roles of them, two or more members can be employed to play the role of one element.

Embodiment 1

Figure 2:
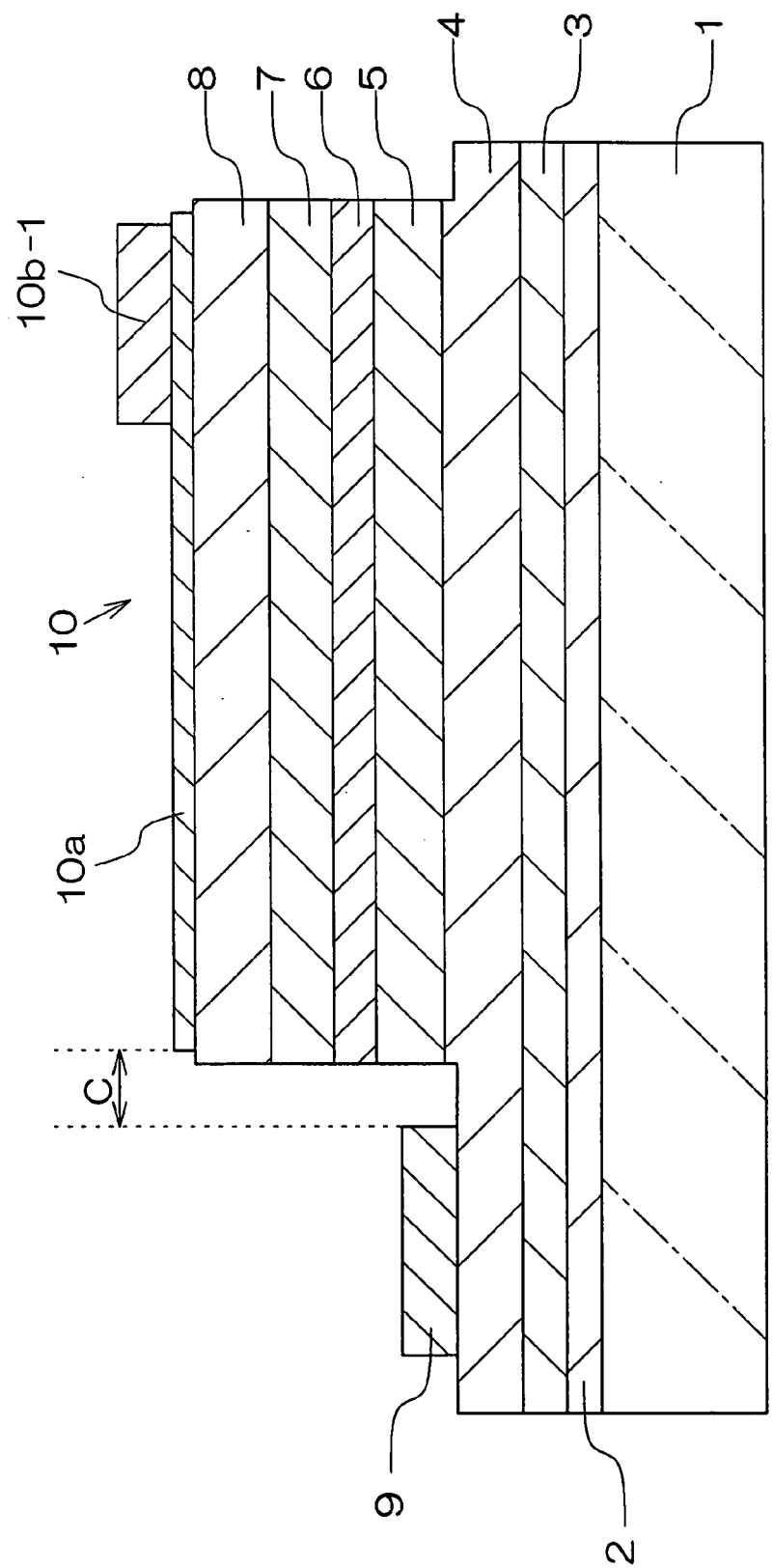
FIG. 2 is a cross-sectional view of the LED of FIG. 1 taken along the line II—II.

The following description will describe an LED of the first embodiment with reference to FIG. 1 and FIG. 2. As shown in these drawings, the LED of this embodiment has a p-side electrode and an n-side electrode positioned in the same plane side. FIG. 1 is a schematic diagram showing the LED of this embodiment as viewed from an electrode-forming-plane side. FIG. 2 is a cross-sectional view schematically showing the layer construction of the LED of this embodiment of taken along the line II—II of FIG. 1.

As shown in FIG. 1, the LED of the embodiment 1 according to the present invention has a shape with a longitudinal direction, which is a predetermined direction, in the view from the electrode-forming-plane side. In this embodiment, the shape is a rectangle, in which one pair of sides is longer than another pair of sides. An n-side connecting portion 9-1 is positioned in proximity to one end in the longitudinal direction of the rectangle. A p-side connecting portion 10b-1 is positioned in proximity to another end in the longitudinal direction of the rectangle so as to be opposed to it.

For example, the LED of this embodiment has layer construction, in which a GaN buffer layer 2, a undoped GaN layer 3, an Si-doped GaN layer 4 as an n-type contact layer, an Si-doped GaN layer 5 as an n-type cladding layer, an InGaN layer 6 as an active layer, an Mg-doped AlGaN layer 7 as a p-type cladding layer, and an Mg-doped GaN layer 8 used as p type contact layer are successively laminated on a sapphire substrate 1, as shown in FIG. 2. In addition, the Mg-doped GaN layer 8, the Mg-doped AlGaN layer 7, the InGaN layer 6, the Si-doped GaN layer 5, and the Si-doped GaN layer 4 are partially removed by etching etc., and the n-side electrode 9 is formed on an exposed surface of the Si-doped GaN layer 4, and then the p-side electrode 10 is provided on virtually the whole of upper surface of the Mg-doped GaN layer 8. Additionally, in this embodiment, the Si-doped GaN layer 4 as the n-type contact layer relates to the n-type nitride semiconductor layer and the Mg-doped GaN layer 8 as the p-type contact layer relates to the p-type nitride semiconductor layer mentioned in the "claims" respectively.

In this embodiment, the n-side electrode 9 is composed of W, Al, W, Pt, and Au, which are successively laminated on the n-type contact layer, however, the other known materials and laminated-layer construction can be employed for the n-side electrode. In addition, the n-side electrode is composed of the n-side connecting portion 9-1 to be connected to a wire as a conductive member after the whole process and an n-side extending portion 9-2 extending from a part of it in the longitudinal direction.

The p-side electrode 10 is composed of a p-side current diffusing member 10a, which is formed on a relatively large area of (virtually the whole of) the p-type contact layer and is in Ohmic contact with the p-type contact layer and diffuses a current supplied from a p-side pad member described below, and the p-side pad member 10b, which is formed on a predetermined part of the p-side current diffusing member. In this embodiment, the p-side electrode is composed of Ni, Au, and Au, which are successively laminated on the p-type contact layer, however, the other known materials and laminated-layer construction can be employed for the p-side electrode. In this case, the p-side current diffusing member is formed in a relatively thin layer of laminated Ni and Au, which allows at least a part of the light from the LED to pass through (hereinafter occasionally refer to "transparency"). On the other hand, the p-side pad member is formed in a relatively thick laminated layer, which does not have transparency. In addition, the p-side pad member 10b is composed of the p-side connecting portion 10b-1 to be connected to a wire as a conductive member after the whole process and a p-side extending portion 10b-2 extending from a part of it in the longitudinal direction so as to be opposed to the n-side connecting portion 9-1.

Furthermore, as shown in FIG. 1, the LED of the first embodiment according to the present invention is divided into an n-side connecting area including the n-side connecting portion 9-1, a p-side connecting area including the p-side connecting portion 10b-1, and a middle area provided between them. Each area is a divided area by the direction virtually perpendicular to the longitudinal direction.

The n-side extending portion 9-2 is positioned in the middle area. In the middle area, the n-side extending portion 9-2 extends so as to be opposed to the p-side current diffusing member 10a. That is, the n-side extending portion is not located in the p-side connecting area but only in the middle area. The n-side extending portion 9-2 and the p-side current diffusing member 10a are positioned so as to be opposed to each other.

Thus, a current can be uniformly provided from the p-side current diffusing member 10a to the n-side extending portion 9-2 in the area where the n-side extending portion 9-2 and the p-side current diffusing member 10a are opposed to each other in the middle area. In addition, since the n-side extending portion 9-2 is positioned in the middle area, it is possible to reduce a concentration current from the n-side extending portion to the p-side current diffusing member 10a in the periphery of the p-side connecting member.

In other words, since the conductive member is directly connected to the p-side connecting member 10b-1, consequentially its periphery becomes an area where a current density tends to be high. However, in the LED of the first embodiment according to the present invention, the n-side extending portion does not extend to the p-side connecting area, so that it is possible to considerably reduce a concentration current in the periphery of the p-side connecting member and to more uniformly supply a current in a wider area in the middle area.

Furthermore, when the p-side current diffusing member 10a has transparency as in this embodiment, it is preferable that the p-side connecting member 10b-1 has the p-side extending portion 10b-2. That is, in order to allow the p-side current diffusing member 10a to have transparency, it is necessary to form its film thickness in a relatively thin film. However, when the p-side current diffusing member 10a is formed in a thin film, which is enough to have transparency, its electrical resistance is inevitably increased. Therefore, it is difficult to diffuse a current supplied from the p-side pad member in the whole of p-side current diffusing member 10a. Thus, the p-side pad member 10b has the p-side extending portion 10b-2 extending from the p-side connecting member 10b-1, whose electrical resistance is relatively low. Providing a current to the p-side current diffusing member 10a after a current spreads in the p-side extending portion 10b-2 can more easily diffuse a current in the whole of the p-side current diffusing member 10a.

Additionally, in the LED of this embodiment, since the n-side extending portion 9-2 and the p-side extending portion 10b-2 are opposed to each other and are positioned at the positions further from each other in the middle area in the direction virtually perpendicular to the longitudinal direction (hereinafter occasionally refer to a "width direction"), it is possible to supply a current in the whole of LED more widely.

On the other hand, generally, the light produced from the inside of the LED is reflected at various interface surfaces such as between a semiconductor layer and another semiconductor layer, between a semiconductor layer and an electrode, or the like, and then is outwardly emitted from the LED. When the light is reflected, not all of the light is reflected but a part of the light is absorbed by each member. If the number of the reflections can be reduced, the number of absorptions also can be reduced. Considering this fact, forming a shape of the LED as thin as possible in the width direction in view from the electrode-forming-plane side can minimize the absorption of the light and can improve outgoing light. Furthermore, forming in the thin shape can allow the light to intensively go out from the thin side. Although a rectangle, a parallelogram, in which one pair of sides is longer than another pair of sides, an ellipse and so on can be used as such a shape, a rectangle is the most preferable considering a practical matter such as a yield.

As mentioned above, it is preferable that the LED is thin in one direction as viewed from the electrode-forming-plane side. However, the p-side connecting portion 10b-1 and the n-side connecting portion 9-1 are required to have enough areas to connect the conductive members to respective electrodes after the whole process. It is considered that forming the LED in the outside shape with the thickness in the width direction as thin as the conductive member can connect. But it is difficult to effectively provide the n-side extending portion.

Therefore, as shown in FIG. 1, the LED of this embodiment has a stair portion in a predetermined part of the p-side current diffusing member 10a in the middle area. The n-side extending portion 9-2 is positioned along the stair portion. In this case, it is preferable that the distance D between the n-side extending portion and the far-side edge of the p-side current diffusing member in view from the n-side extending portion in the middle area is shorter than the distance E, which is the width of the p-side current diffusing member in the p-side connecting area in the width direction. This can allow the p-side connecting member to have a sufficient area to be connected to the conductive member, and can allow the LED to be thinner in the width direction.

Further, when the distance D is shorter than the distance E, it is preferable that the distance A between the n-side extending portion and the p-side current diffusing member, which are opposed to each other, is shorter than the distance B between the tip of the n-side extending portion and the p-side current diffusing member positioned in the p-side connecting area side from the tip. Besides, the p-side current diffusing member positioned in the p-side connecting area side from the tip is defined as the p-side current diffusing member in proximity to the p-side connecting area and in the portion where the n-side extending portion and the p-side current diffusing member are not opposed to each other. In FIG. 1, the p-side current diffusing member has a slight curve in proximity to the p-side connecting area. Accordingly, the distance B is the distance between the n-side extending portion and the slight curve.

That is, as explained above, since the conductive member is directly connected to the p-side connecting portion 10b-1, consequentially its periphery becomes the highest current density area. However, in this embodiment, the distance A is shorter than the distance B, so that it is possible to reduce a current concentration in the area of the distance B, and to more uniformly supply a current in the area of the distance A.

Further, as shown in FIG. 1, in the LED of this embodiment, the n-side extending portion and the p-side current diffusing member are opposed to each other in the longitudinal direction. It is preferable that that the distance A between the n-side extending portion and the p-side current diffusing member, which are opposed to each other, is shorter than at least the distance C between the n-side connecting portion and the p-side current diffusing member, which are opposed to each other, in the longitudinal direction in proximity to the tip of the p-side current diffusing member. That is, since the tip of the p-side extending portion is close to the n-side connecting portion, consequentially its periphery becomes an area, which tends to be a high current density area. However, the distance A is shorter than the distance C, so that it is possible to reduce a current concentration in the area of the distance C, and to more uniformly supply a current in the area of the distance A.

In addition, the LED of this embodiment is described as the LED, in which the p-side current diffusing member can sufficiently diffuse a current. However, when the p-side current diffusing member does not sufficiently diffuse a current, altering the shape of the p-side pad member can substantially increase or decrease the distances A, B and C. In particular, in order to increase the distance A, the p-side extending portion can be thinner and can keep more distance from the n-side extending portion, for example. In addition, in order to increase the distance B, one corner of the substantially quadrangle of the p-side connecting portion as shown in FIG. 1 can be more widely rounded so as to keep more distance from the n-side extending portion. Similarly, in order to increase the distance C, the p-side extending portion can be shorter so as to keep more distance from the n-side connecting portion.

In addition, regarding the distance C, when the p-side current diffusing member does not sufficiently diffuse a current, the effect of the relationship between the distance A and the distance C increases as the distance is closer to the tip of the p-side extending portion. On the other hand, the effect is decreased with the distance from the tip of the p-side extending portion. Therefore, in order to increase the area of light emission, for example, the distance between the p-side current diffusing member and the n-side extending portion, which are opposed to each other, in the longitudinal direction can be shorter with the distance from the tip of the p-side extending portion.

Further, in order to prevent cutting off the light emitted from the active layer as a light emitting portion in the side surface direction, the n-side extending portion is provided at a position lower than the light-emitting portion. In this embodiment, since the LED has a rectangular outside shape in view from the electrode-forming-plane side, the light is mainly emitted not in the longitudinal direction but in the width direction. Therefore, such a construction is especially effective. In addition, in this embodiment, the LED has a DH (double hetero) structure as the device construction. Accordingly, the InGaN layer as the active layer relates to the light-emitting portion. Needless to say, when the LED has pn junction as the device construction, its boundary relates to the light-emitting portion.

Additionally, when the LED of this embodiment is mounted by face-up mounting, wires such as gold wires are mainly used as the conductive member. On the other hand, when it is mounted by face-down mounting, solder etc. is used as the conductive member.

In this embodiment, the p-side current diffusing member is formed in a relatively thin layer, which allows at least a part of the light from the LED to pass through, however, the p-side current diffusing member can be formed in a relatively thick layer, which does not allows the light from the LED to pass through. Especially, when the LED is mounted by face-down mounting, reflecting the light by the p-side current diffusing member, in which various kinds of metal members such as Rh, Al, and Ag with predetermined thickness are laminated, can improve light outgoing toward the observation side. In this case, it is not necessary to provide the p-side pad member on the predetermined portion of the p-side current diffusing member, and it is possible to integrally form them similar to the n-electrode.

In addition, providing bumps and dips on a predetermined part of the LED can diffuse the light. Consequently, it is possible to improve efficiency of outgoing light. For example, providing bumps and dips on the surface of the n-type contact layer, on which the n-side electrode is formed, or at the boundary between the sapphire substrate and the epitaxial layer can effectively diffuse the light.

Especially, since the LED of this embodiment has a shape with the longitudinal direction in view from the electrode-forming-plane side, the light can be effectively emitted not only in the vertical direction (the semiconductor layer laminating direction) but also in the horizontal direction (especially in the width direction). Furthermore, for example, providing bumps and dips on the surface of the n-type contact layer can improve the light emission in the vertical direction in addition to the horizontal direction. This can three-dimensionally provide the light emission. In addition, in order to form bumps and dips in the surface of the n-type contact layer, predetermined shapes of dips are formed by RIE (reactive ion etching) with a mask having predetermined shapes of openings such as circular shapes, triangular shapes, and quadrangular shapes. Additionally, removing a part other than predetermined shapes can form bumps and dips. In other words, forming bumps can also form bumps and dips. When being formed on the n-type contact layer, needless to say, bumps and dips can be formed on a part other than the boundary between the n-side electrode and the n-type contact layer. Moreover, bumps and dips can be also formed on the boundary.

Further, the process for forming bumps and dips and the process for exposing the surface where the n-side electrode is laminated are performed by one operation. That is, after the p-type contact layer is formed, a resist film is applied thereon and is exposed to form a desired pattern. Then, a portion including the light-emitting layer, which acts as the light-emitting device, and a portion where the n-side electrode is positioned on the n-type contact layer after the whole process, and a projecting columnar bumps including layers from the n-type contact layer to the p-type contact layer on the n-type contact layer can be formed by the resist, which remains after being exposed as the mask. Thus, the exposed surface where the n-side electrode is formed and the projecting columnar portion can be simultaneously formed. Therefore, it is possible to simplify the process. Accordingly, when the process for forming bumps and dips and the process for exposing the surface where the n-side electrode is laminated are performed by one operation, consequentially the projecting columnar bump is formed at a position higher than the active layer. The projecting columnar bump can allow the light traveling through the n-type contract layer to reflect toward the observation side and to outgo. In addition, the traveling direction of the light emitted from the active layer in the side surface direction is varied toward the observation side directly by the projecting columnar bump, so that the efficiency of light outgoing toward the observation side is more effective. The projecting columnar bump can have various desired shapes such as a circular shape, a rhombic shape, a triangular shape, and a hexagonal shape in view from the light observation side. Additionally, it is preferable that the projecting columnar bump has a shape, which is thinner with distance from the n-type contact layer side toward p-type contact layer side. This can further improve light outgoing toward the observation side.

Needless to say, the effect of the bumps and dips mentioned above is not only for the LED of this embodiment but also for LEDs with the other construction.

Besides, in any of the cases mentioned above, the end surfaces of the shapes of the bumps and dips or the shape of the projecting columnar bump is formed at some angle with the end surface of the light emission, and it is preferable that the end surface have an edge perpendicular to it. This can allow the emitted light to effectively outgo. Especially, it is preferable that the shapes of the bumps and dips or the shapes of the projecting columnar bumps in view from the light emission observation side is a triangular shape, in which one corner of the triangular shape is opposed to the light emission end surface and one edge of the triangular shape opposing to the one corner is positioned in the far side from to the light emission end surface and is substantially parallel with the light emission end surface. This can allow the one edge, which is opposed to the light emission end surface at some angle, to be greater. That is, the triangular shapes can be radially positioned against the light emission end surface so that the one corner of each triangular shape is opposed to the light emission end surface. In addition, it is preferable that the triangular shape is an isosceles triangle or an equilateral triangle. In this case, the one corner mentioned above is the corner, which the two edges with the same length form. Thus, it is possible to allow the light to be uniformly emitted. Additionally, the light emission end surface is defined as the end surface of the laminated semiconductor having the layers from the n-type contact layer to the p-type contact layer, in which a current is provided and the light is emitted.

Furthermore, in order to allow the light emitted in the active layer to outgo, it is preferable that the number of reflections of the light in the laminated semiconductor construction be small. A designer can spontaneously design the number of reflections of the light, which outgoes after reflection in the laminated semiconductor construction based on the critical angle of approximately 45 degrees calculated by the Snell's law, when the refractive index of sapphire used as the substrate is 1.77 and the approximate refractive index of the laminated semiconductor construction considered as GaN is 1.77, for example. Specifically, the distance of the laminated semiconductor construction in the width direction, which has the end surfaces of the active layer in the middle area as shown in FIG. 1, can be designed so as to allow the light to reflect one time, for example. Thus, it is possible to further improve light outgoing in the width direction. Needless to say, this can be applied to the distance designing not only about the width of the laminated semiconductor construction, which has the end surfaces of the active layer in the middle area, but also about various kinds of distances.

Embodiment 2

Figure 3:
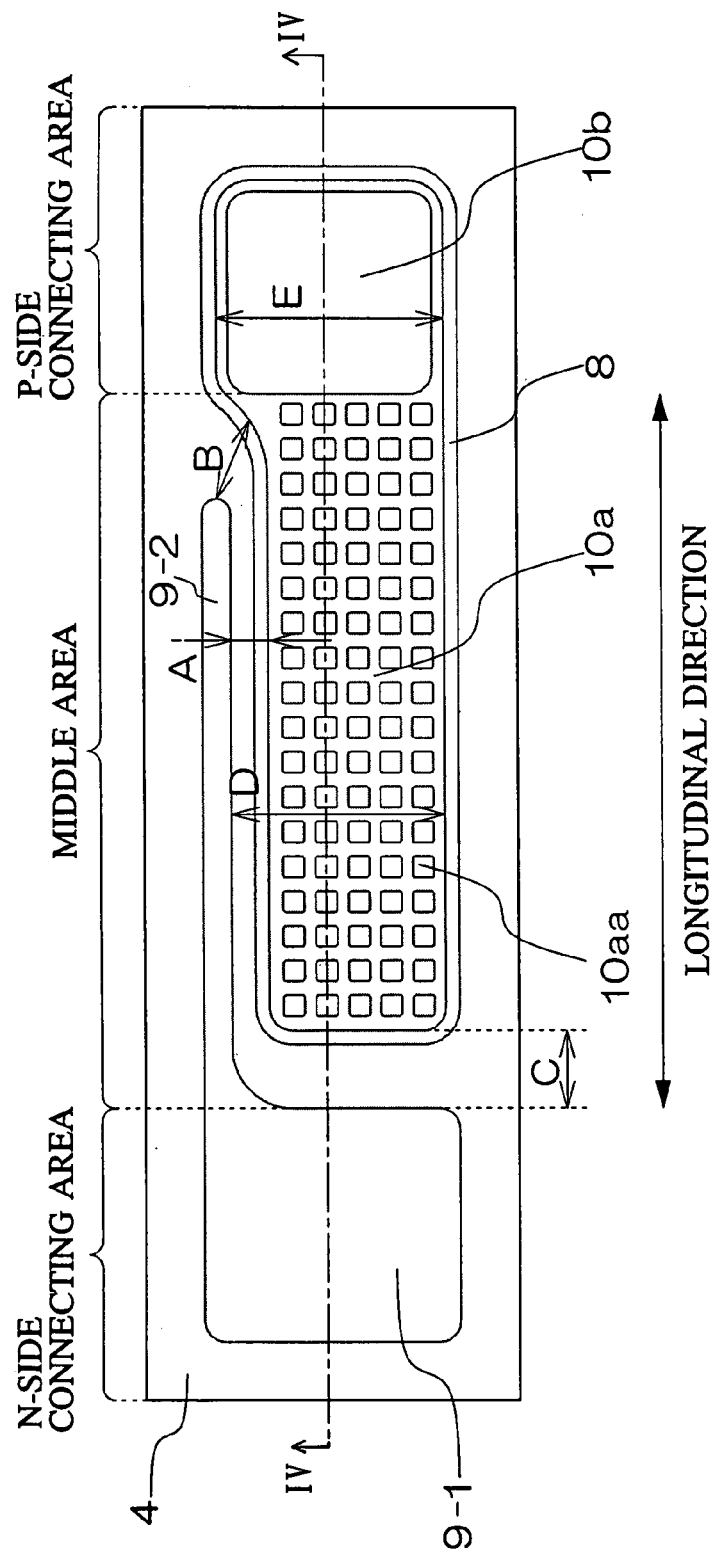
FIG. 3 is a plan view of an LED of a second embodiment according to the present invention from an electrode-forming-plane side.
Figure 4:
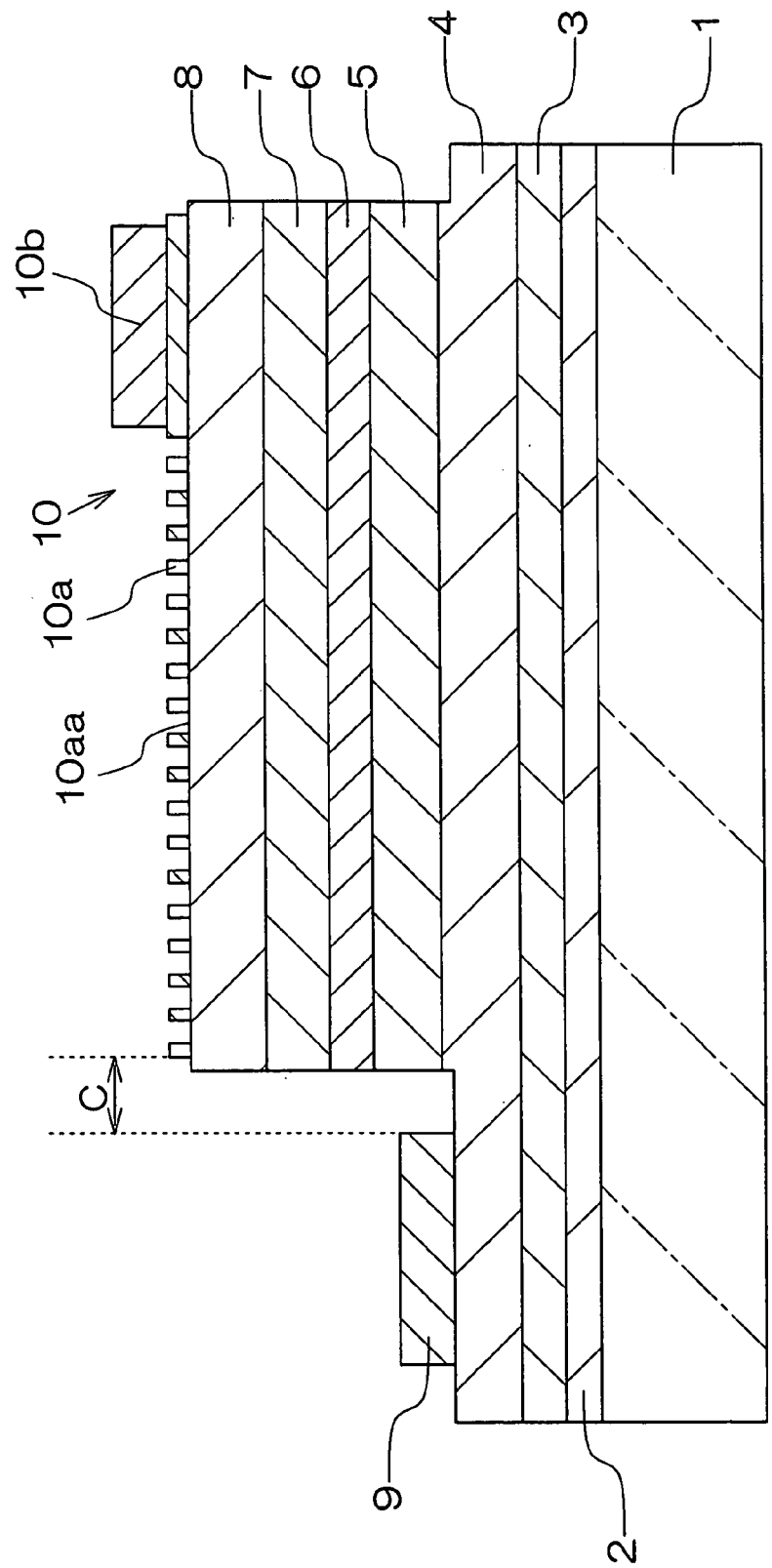
FIG. 4 is a cross-sectional view of the LED of FIG. 3 taken along the line IV—IV.

The following description will describe an LED of the second embodiment with reference to FIG. 3 and FIG. 4. FIG. 3 is a schematic diagram showing the LED of this embodiment as viewed from an electrode-forming-plane side. FIG. 4 is a cross-sectional view schematically showing layer construction of the LED of this embodiment taken along the line IV—IV. In addition, the same reference signs show the members of similar function in the first embodiment.

The LED of this embodiment has the same construction mentioned as the LED of the first embodiment except that the p-side current diffusing member 10a has a plurality of openings 10aa. In addition, the p-side pad member does not have the p-side extending portion. In this case, the p-side extending portion does not cut off the light emitted from the active layer. Such a construction is preferable in view of outgoing light. Needless to say, the LED can also have the p-side extending portion in view of current diffusing. A designer can spontaneously choose the constructions on the basis of their effects.

The p-side electrode 10 is composed of a p-side current diffusing member 10a, which is formed on a relatively large area of (virtually the whole of) the p-type contact layer and is in Ohmic contact with the p-type contact layer and diffuses a current supplied from a p-side pad member described below, and the p-side pad member 10b, which is formed on a predetermined part of the p-side current diffusing member. The p-side current diffusing member has a plurality of openings 10aa, in which the p-type contact layer is substantially exposed. At least a part of the light from the LED goes out thorough the openings.

In this embodiment, the p-side electrode is composed of Rh, Ir, and Au, which are successively laminated on the p-type contact layer, however, the other known materials and laminated-layer construction can be employed for the p-side electrode. In this case, Rh and Ir successively laminated relate to the p-side current diffusing member, and Au relates to the p-side pad member. In this embodiment, the p-side connecting portion 10b to be connected to the conductive member after the whole process relates to the p-side pad member.

Further, in this embodiment, when the p-side current diffusing member has a plurality of openings, it is not necessary for the p-side connecting portion to have the p-side extending portion. That is, when the p-side current diffusing member has the openings, it is possible to form it in a relatively thick film. The reason is that a current supplied from the p-side pad electrode can be easily diffused since forming it in a relatively thick film can reduce electrical resistance. However, when the p-side current diffusing member is formed in the film, which is too thick to have transparency, it is difficult to allow the light to outgo through the p-side current diffusing member. Therefore, providing a plurality of openings in the p-side current diffusing member can reduce its electrical resistance and can allow the light to outgo.

In addition, as shown in FIG. 4, the p-side pad electrode is formed on the part of p-side current diffusing member without the openings, and the p-side connecting member can be also formed on the part of p-side current diffusing member with the openings as another embodiment. That is, the p-side pad member can be formed on the upper surface and the inside recessed portion of the p-side current diffusing member, whose cross-sectional view has projecting portions and recessed portions. This can increase the contact area between the p-side pad member and the p-side current diffusing member. Accordingly, it is possible to improve the intimate contact between the p-side pad member and the p-side current diffusing member. Additionally, it is possible to effectively supply a current from the p-side pad member to the p-side current diffusing member.

In addition, needless to say, the shape, size and position of the openings can be spontaneously formed. Additionally, when the end portion, which has the openings, of the p-side current diffusing member in the n-side extending portions side is not straight but uneven, the n-side extending portion and the p-side current diffusing member can be opposed to each other in a general view.

Further, as shown in FIG. 1 or FIG. 3, for example, a pair of the n-side extending portion and the p-side current diffusing member, which are opposed to each other, a pair of the n-side extending portion and the p-side extending portion, which are opposed to each other, and a pair of the n-side connecting portion and the p-side current diffusing member, which are opposed to each other, are substantially parallel, respectively. However, needless to say, it is not necessary for them to be parallel. In this case, the distances A, B, C, D and E are defined as the minimum distance in the respective area.

Figure 5:
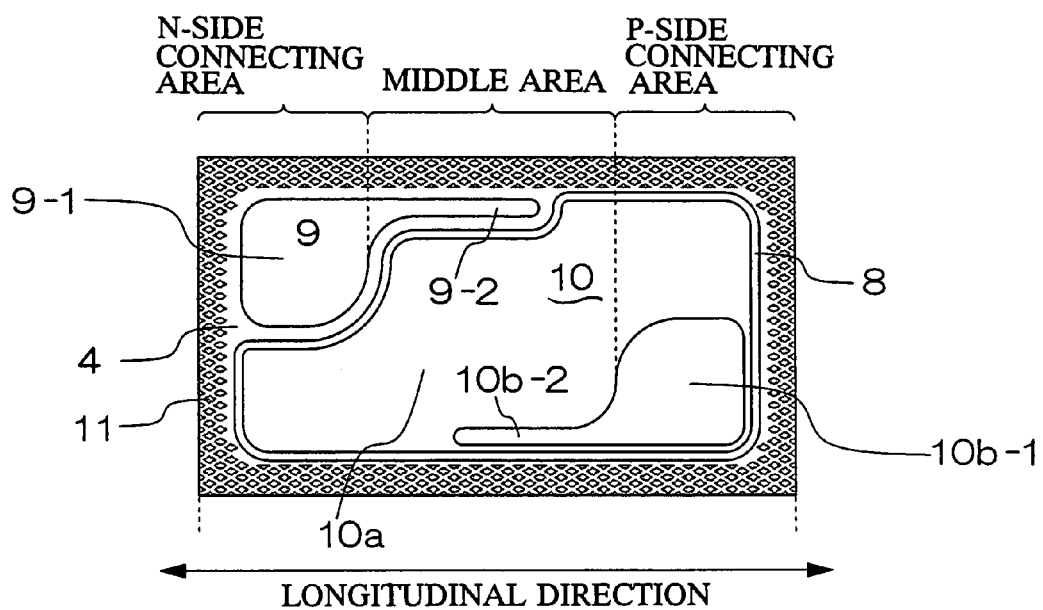
FIG. 5 is a plan view of an LED of a third embodiment according to the present invention from an electrode-forming-plane side.

In the first embodiment and the second embodiment, as shown in FIG. 1 and FIG. 3, the p-side current diffusing member is not positioned in the n-side connecting area, that is, the p-side current diffusing member is positioned in the middle area. However, as shown in FIG. 5 thorough FIG. 8, the p-side current diffusing member can be positioned in the n-side connecting area, for example. In this case, as shown in each drawing, it is preferable that the n-side pad member and the p-side pad member are positioned at opposite corners of the light-emitting diode, which has the rectangular shape and the shape with the longitudinal direction, respectively, for example. Additionally, in this case, the n-side connecting area, the middle area, and the p-side connecting area are divided areas, whose boundaries are substantially perpendicular to the longitudinal direction. The following description will describe the third embodiment and the fourth embodiment with reference to FIG. 5 through FIG. 8.

Embodiment 3

Figure 6:
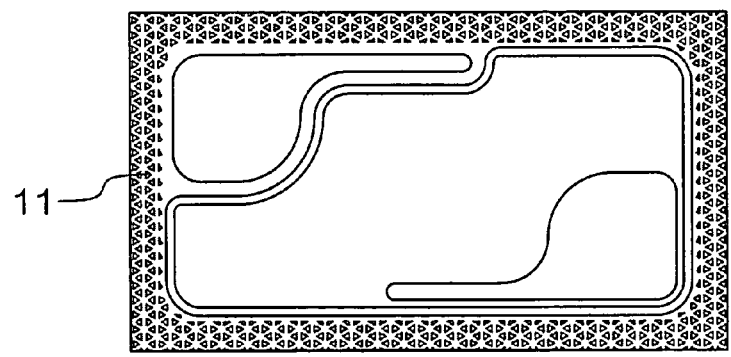
FIG. 6 is a plan view of another LED of a third embodiment according to the present invention from an electrode-forming-plane side.

The following description will describe an LED of the third embodiment with reference to FIG. 5 and FIG. 6. In addition, the same reference signs show the members of similar function as in the first embodiment. The LED of this embodiment has the same construction mentioned as the LED of the first embodiment except the members described below.

In the LED of this embodiment, as mentioned above, the p-side current diffusing member 10a is formed also in the n-side connecting area. The n-side pad member 9-1 and the p-side pad member 10b-1 are positioned at opposite corners of the LED with a rectangular shape as viewed from the electrode-forming-plane side. In addition, the n-side extending portion 9-2 and the p-side extending portion 10b-2 are partially opposed to each other. Additionally, a plurality of bumps 11, which improves light outgoing, are provided in the area, in which the n-type contact portion 4 is exposed in order to form the n-side electrode, so as to surround the laminated-layer construction of semiconductor including the active layer.

FIG. 5 shows an example of the LED having bumps 11 with a rhombic shape in view from the electrode-forming-plane side. FIG. 6 shows an example of the LED having bumps 11 with a triangular shape in view from the electrode-forming-plane side. When the bumps 11 with a predetermined shape are closely provided, this can improve light outgoing toward the observation side in face-up mounting. The reason is not obvious, but it is considered that diffusing the light, which travels in the n-side contact layer under the bumps 11 at the base of the bumps 11, or allowing the light, which travels in the n-side contact layer, to travel into the inside of the bumps 11 improves the efficiency of light outgoing toward the observation side. Additionally, it is considered that positioning the top of the bumps and dips higher than the position of the active layer as viewed from the side of the LED (positioning them in the p-side) allows the light from the emitting side surface to directly strike the bumps, so that the light changes its direction toward the observation side.

Further, it is more preferable that each of the bumps 11 is positioned so that all the light from the emitting side surface strikes any of the bumps 11, in other words, so that the light from the emitting side surface cannot pass through them in a straight line outwardly from the LED. Specifically, at least one of the bumps is positioned in any of predetermined conceivable lines, in which the light passes through, extended from the emitting side surface. Thus, more outgoing light can be expected.

Furthermore, in order to simplify the process, the bumps can be formed in the process, in which the n-type contact layer is exposed to form the n-side electrode. In this case, each of the bumps has the construction with layers from n-type contact layer 4 to the p-type contact later 8 laminated from the substrate. In addition, when the bumps are formed by etching, etc., the top surfaces of the bumps as viewed from the electrode-forming-plane side do not always have the same shapes because of chipping of the edge, for example. Even in such a case, the efficiency of outgoing light can be improved. The reason is that forming the bumps, whose tops are higher than the active layer, is most important.

Embodiment 4

Figure 7:
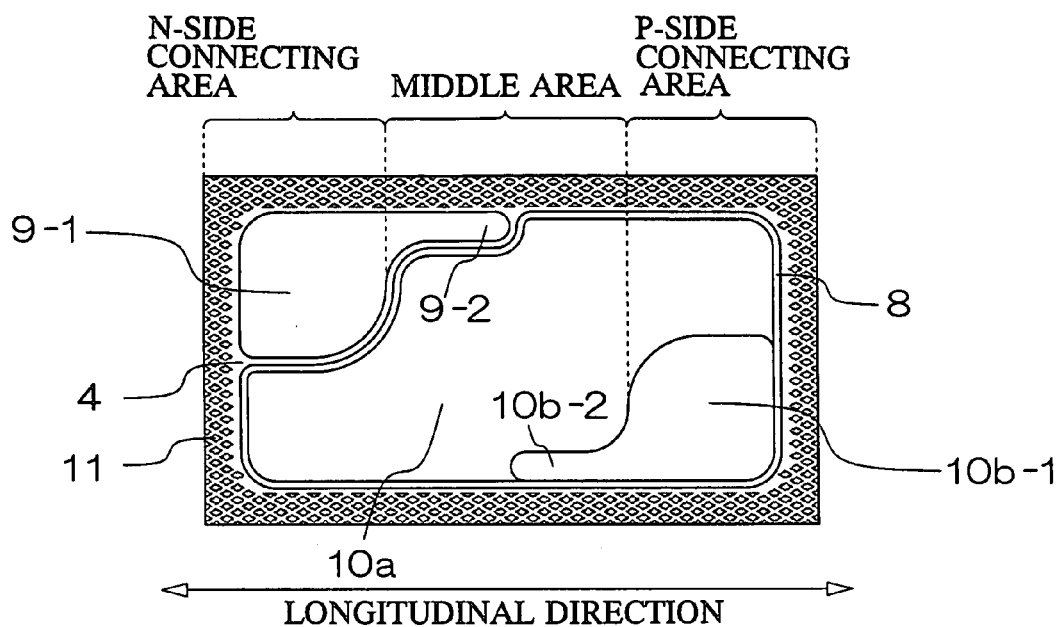
FIG. 7 is a plan view of an LED of a fourth embodiment according to the present invention from an electrode-forming-plane side.
Figure 8:
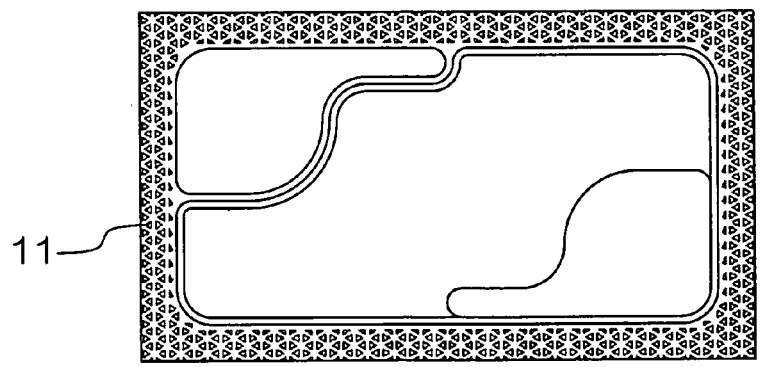
FIG. 8 is a plan view of another LED of a fourth embodiment according to the present invention from an electrode-forming-plane side.

The following description will describe an LED of the fourth embodiment with reference to FIG. 7 and FIG. 8. In addition, the same reference signs show the members of similar function in the first embodiment. The LED of this embodiment has the same construction mentioned as the LED of the first embodiment except the members described below.

In the LED of this embodiment, as mentioned above, the p-side current diffusing member 10a is formed also in the n-side connecting area. The n-side pad member 9-1 and the p-side pad member 10b-1 are positioned at opposite corners of the LED with a rectangular shape in view from the electrode-forming-plane side. In addition, the n-side extending portion 9-2 and the p-side extending portion 10b-2 are not opposed to each other even partially. Additionally, a plurality of bumps 11, which improves light outgoing, is provided in the area, in which the n-type contact layer 4 is exposed in order to form the n-side electrode. Regarding the bumps 11, the bumps 11 in FIG. 7 are similar to those of FIG. 5, and the bumps 11 in FIG. 8 are similar to those of FIG. 6.

Embodiment 5

Figure 9:
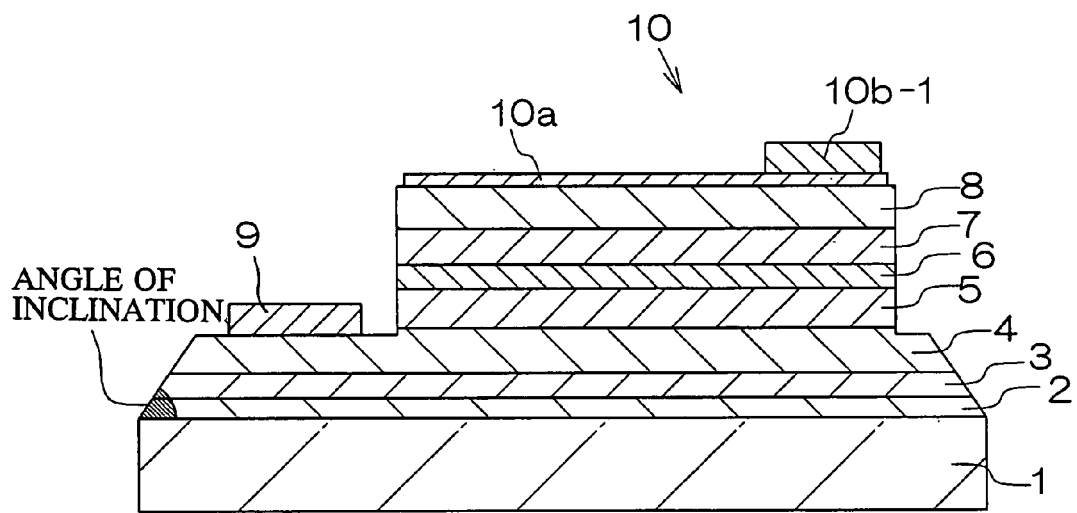
FIG. 9 is a cross-sectional view of an LED of a fifth embodiment according to the present invention.

The following description will describe an LED of the fifth embodiment with reference to FIG. 9. In addition, the same reference signs show the members of similar function in the first embodiment. The LED of this embodiment has the same construction mentioned as the LED of the first embodiment except the members described bellow.

As shown in FIG. 9, the LED according to this embodiment has a surface that is inclined from the boundary between the sapphire substrate 1 and the buffer layer 2 to the surface, on which the n-side electrode 9 is formed, of the n-type contact layer 4. Forming such an inclined surface can improve light outgoing toward the observation side in face-up mounting or face-down mounting.

Specifically, in face-down mounting for example, when the angle of inclination shown in FIG. 9 is set for 64°, the light outgoing toward the observation side can be approximately 1.1 times as compared with the first embodiment, whose angle of inclination is 90°. In addition, when the angle of inclination shown is set for 34°, the light outgoing toward the observation side can be approximately 1.6 times as compared with the angle of inclination of 90°.

Further, in this embodiment, it is described that the LED has a surface that is inclined from the boundary between the sapphire substrate 1 and the buffer layer 2 to the surface, on which the n-side electrode 9 is formed, of the n-type contact layer 4, however, such an inclined surface can be provided another area. That is, such an inclined surface can be provided on at least one part in the side surface of the LED. For example, a surface inclined from the surface, on which the n-side electrode 9 is formed, of the n-type contact layer 4 to the surface, on which the p-side electrode 10 is formed, of the p-type contact layer can be provided in addition to the construction mentioned above. Forming such an inclined surface in the larger side surface area can make the effect mentioned above more sufficient.

Furthermore, it is possible to improve light outgoing toward the observation side in any of face-up mounting or face-down mounting by forming a single layer of or a multi-layer of insulating material(s) on such an inclined surface with control of thickness, etc. of known insulating materials such as an aluminum oxide, an aluminum nitride, a silicon oxide, a yttrium oxide, a titanium oxide, a zirconium oxide, ITO, an indium oxide, tin oxide, so that the light from the inside of the LED is transmitted or is reflected. Besides, in this embodiment, it is described that the LED has a basic device construction similar to the first embodiment, however, needless to say, it is also possible to improve light outgoing toward the observation side by forming such a inclined surface in other device construction.

Embodiment 6

Figure 10:
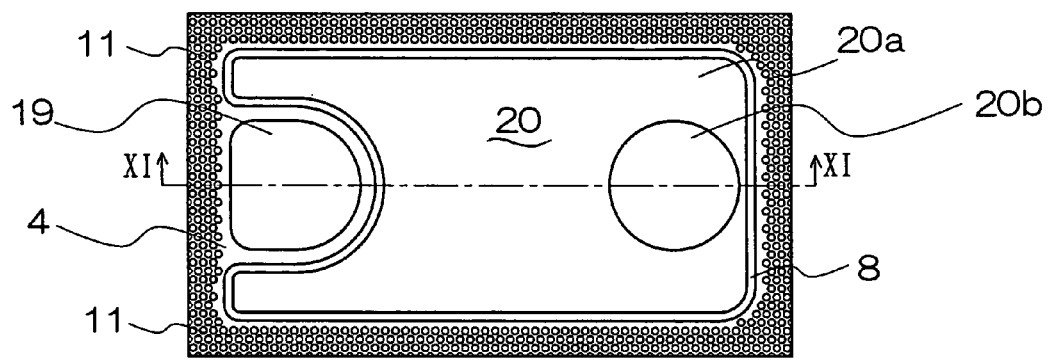
FIG. 10 is a plan view of an LED of a sixth embodiment according to the present invention from an electrode-forming-plane side.
Figure 11:
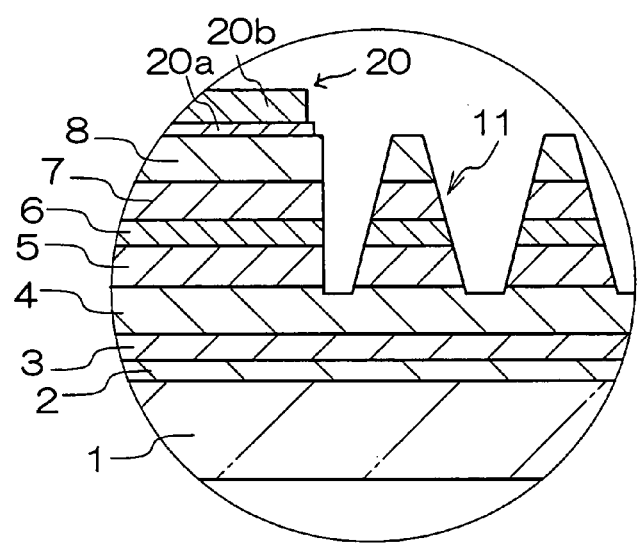
FIG. 11 is a partial cross-sectional view of the LED of FIG. 10 taken along the line XI—XI.

The following description will describe an LED of the sixth embodiment with reference to FIG. 10 and FIG. 11. FIG. 10 is a plan view of the LED of this embodiment as viewed from the electrode-forming-plane side. FIG. 11 is a cross-sectional view of a periphery of a pad member 20*b* of the p-side electrode 20 (hereinafter occasionally refer to a "p-side pad member") taken along the line XI—XI of FIG. 10. FIG. 11 shows the relationship of the positions between the laminated-layer construction of semiconductor in a first area and the bumps 11 positioned in a second area different from the first area.

In the LED of this embodiment, the p-side electrode 20 and the n-side electrode 19 are provided in the same plane side. The LED has a construction, in which the light outgoes from the electrode-forming-plane side as an observation side. The laminated-layer construction of semiconductor of the LED is composed of a GaN buffer layer 2, a undoped GaN layer 3, an Si-doped GaN layer 4 as an n-type contact layer, an Si-doped GaN layer 5 as an n-type cladding layer, an InGaN layer 6 as an active layer, an Mg-doped AlGaN layer 7 as a p-type cladding layer, and an Mg-doped GaN layer 8 used as p-type contact layer are successively laminated on a sapphire substrate 1 similar to the first embodiment. In addition, the Mg-doped GaN layer 8, the Mg-doped AlGaN layer 7, the InGaN layer 6, the Si-doped GaN layer 5, and the Si-doped GaN layer 4 are partially removed by etching etc., the n-side electrode 19 is formed on an exposure surface of the Si-doped GaN layer 4, and the p-side electrode 20 is provided on the Mg-doped GaN layer 8. The n-side electrode 19 is composed of W, Pt, and Au, which are successively laminated from the n-type contact layer. A current diffusing member 20*a* of the p-side electrode (hereinafter occasionally referred as a "p-side current diffusing member") is formed on virtually the whole of p-type contact layer. The current diffusing member is composed of Ni and Au, which are successively laminated from the p-type contact layer (or can be alloy of Ni and Au). The p-side pad electrode 20*b* is composed of W, Pt, and Au, which are successively laminated similar to the n-side electrode. As mentioned above, since the n-side electrode 19 and the p-side pad electrode 20*b* are formed in the same construction, the n-side electrode 19 and the p-side pad electrode 20*b* can be formed in one forming process. In addition, in this embodiment, in order to reserve an emitting area (first area), the p-side current diffusing member 20*a* partially surrounds the n-side electrode 19.

In the LED of this embodiment, the bumps 11, which form asperities (bumps and dips), surround the periphery of the first area. In the LED of this embodiment, since the first area, in which the light is emitted in driving, is surrounded by the bumps, the surface area of the LED in the electrode-forming-plane side plays a role in the control of the efficiency of light outgoing and of the directivity of the light. Generally, in an LED, various semiconductor layers are laminated on a substrate such as sapphire, a predetermined part is thinned, and then each LED can be obtained by dividing at the thinned part. In this invention, a particular area to form the bumps can be provided, however, the bumps can be also formed in the thinned part to divide a wafer, or in the periphery of the n-side electrode. This can avoid increasing its process. Accordingly, it is preferable that the bumps of this invention are formed in the desired area of surface of the n-type contact layer, which is conventionally provided in the electrode-forming-plane side.

The n-type contact layer has the first area, in which the laminated-layer construction of semiconductor with the p-side electrode is provided, and the second area which is different from the first area as viewed from the electrode-forming-plane side. The n-electrode 19 and the plurality of bumps 11 are provided in the second area. As shown in FIG. 11, the top of the bumps provided in the second area is positioned in the p-type contact layer side from the active layer in a cross-sectional view of the LED. In addition, it is preferable that the top is positioned at virtually as high as the p-type contact layer. That is, the top is formed higher than the active layer. On the other hand, the bottoms of the asperities are formed lower than the active layer. In this embodiment, since the LED has the DH structure, the top of the asperities can be at least higher than the boundary between the active layer and the n-side layer adjacent to it. However, it is preferable that the tops of the bumps are higher than the boundary between the active layer and the p-side layer adjacent to it. Additionally, the bottom of the asperities can be at least lower than the boundary between the active layer and the p-side layer adjacent to it. However, it is preferable that the bottom of the asperities is lower than the boundary between the active layer and the n-side layer adjacent to it. Furthermore, similar bumps can be formed not only in the DH structure but also in the structure, in which the active layer with the quantum-well-structure sandwiched between the n-side layer and the p-side layer, for example. That is, the top of the asperities is higher than the boundary between the active layer and the n-side layer, and it is preferable that it is higher than the boundary between the active layer and the p-side layer. Moreover, the bottom of the asperities is lower than the boundary between the active layer and the p-side layer, and it is preferable that it is lower than the boundary between the active layer and the n-side layer.

Such a construction can improve the efficiency of light outgoing toward the observation side 10% to 20%. The reason is not obvious, but it is considered as the reasons 1–3 shown below.

That is:

Reason 1

The light, which travels in the n-side contact layer, travels into the inside of the bumps, and then outgoes through the top of or the middle of the bumps toward the observation side.

Reason 2

The light, which is outwardly emitted from the side surface of the active layer, is reflected and diffused at the plurality of bumps, and then outgoes toward the observation side.

Reason 3

The light, which travels in the n-side contact layer, is reflected and diffused at the bases of the bumps (connecting portion between the n-type contact layer and the bumps), and then outgoes toward the observation side.

In addition, providing the plurality of bumps can allow the light to uniformly outgo in the whole of the observation side.

Additionally, since the bumps including the p-type contact layer are formed, the top is virtually as high as the p-type contact layer. Accordingly, the light can effectively go out from the top of each of the bumps toward the observation side without being interrupted by the first area, in which the laminated-layer construction of semiconductor with the p-side electrode is formed. Moreover, forming the bumps higher than the p-type contact layer, preferably higher than the p-side electrode can allow the light to go out more effectively.

Further, forming the bumps, which incline so as to be gradually thinner toward the semiconductor laminating direction in the cross-sectional view of the bumps, or from the n-type contact layer to the p-type contact layer, can make the effect mentioned above more sufficient. In other words, the light from the active layer can be totally reflected at the surface of the bumps, or the light traveling in the n-type contact layer can be diffused by forming the bumps with the angle of inclination on purpose. Consequently, it is possible to allow the light to effectively outgo toward the observation side. It is preferable that the angle of the inclination of the bumps is 30 to 80°, more preferably 40 to 70°.

Furthermore, the shape of the cross-sectional view of the bumps can be formed in various shapes such as a conical, or a semicircle, however, it is preferable that the shape is a trapezoid. That is, it is preferable that the bumps are formed in a frustum of a cone. The control of the directivity of the light can be easier, and also the light can uniformly outgo as the whole by such a construction. When the light outgoes from the p-type contact layer so that the p-type contact layer is an observation side, it is considered that this effect can be obtained by allowing the observation sides of the bumps not to include the summits but to include the planes.

In addition, when the shape of the cross-sectional view of the bumps can be formed in a trapezoid, the other dips can be formed on the top edges of the trapezoid (p-side). Such a construction is preferable. The reason is that the light traveling in the n-type contact layer can effectively go out toward the observation side by the dips formed on the top portions of the bumps, when the light travels into the inside of the bumps.

Additionally, in the LED according to the present invention, it is preferable that two or more of the bumps at least partially overlap in the direction substantially perpendicular to the emitting side surface of the laminated-layer construction of semiconductor formed in the first area of the n-type contact layer. Thereby, the light from the first area strikes the bumps with a high probability. Accordingly, the effect mentioned above can be easily obtained.

It is preferable that the bumps are simultaneously formed in the process, in which the n-type contact layer is exposed to the n-side electrode. The LED of this embodiment has the p-side electrode and the n-side electrode in the same plane side. Accordingly, it is necessary to remove at least the area for the n-side electrode so as to expose the n-type contact layer after the layers up to p-type contact layer are laminated on the substrate. In detail, for example, first the p-type contact layer is laminated, secondly a desired pattern of a resist film is applied, finally the portion except the portion where the p-side electrode is formed later (the first area) and the portion where the bumps are formed (a part of the second area) is removed to expose the n-type contact layer by etching, etc. Thus, both of the exposed portion where the n-side electrode is formed and the bumps can be simultaneously formed. Therefore, it is possible to simplify the process. Besides, in this case, a resist film is used as the mask, however an insulating film such as $SiO_2$ can be used as the mask.

The bumps formed as mentioned above have the same laminated-layer construction as the laminated-layer construction of semiconductor in the first area. However, the active layer in the first area acts as a light-emitting layer, on the other hand, the active layer in the second area does not act as a light-emitting layer. The reason is that the p-side electrode is formed in the first area, but the p-side electrode is not formed in the second area (the bumps). That is, carriers (holes and electrons) are supplied to the active area in the first area by an application of a voltage, but carriers are not supplied to the active layer of the bumps in the second area by an application of a voltage. Thus, the bumps according to the present invention do not emit by themselves.

On the other hand, when a plurality of bumps, which cannot emit, is provided in the opening portion, which is provided inside the first area and is completely surrounded by the first area, the opening portion can interrupt the electric path. Accordingly, the resistance of the device is increased. Furthermore, such a construction tends to have nonuniform light emission. Such a construction is not preferable in view of these matters. Therefore, in the present invention, it is preferable that at least the n-type contact layer, an active layer, and p-type contact layer are laminated uniformly to uniformly emit in the area where there is usually a light-emission area (the first area), and it is preferable that the plurality of bumps are provided only in the area where there is not usually a light-emission area (the second area). In the present invention, the plurality of bumps in the area where there is not usually a light-emission area is provided, so that the effect mentioned above can be obtained by the use of the area where there is not usually a light-emission area.

Further, the bumps formed as mentioned above have the same laminated-layer construction as the laminated-layer construction of semiconductor in the first area. In other words, the bumps are composed of a plurality of layers, which are made of different materials. Different materials necessarily have different refractive indexes. Accordingly, it is considered that the light enclosed in the bumps is frequently reflected at each boundary so that this improves efficiency of light outgoing toward the observation side.

Furthermore, although the number, the density, etc. of the bumps are not specifically limited in the present invention, according to the experiments of the inventors, it is preferable that the number of the bumps in the second area is 100 or more, more preferably 200 or more, still more preferably 300 or more, and the most preferably 500 or more. This can improve the effect mentioned above. In addition, it is preferable that the percentage of the area of the bumps for the second area (in detail, the percentage of the area of the boundary between the bumps and the second area in the second area) is 20% or more, more preferably 30% or more, the most preferably 40% or more. Besides, although the upper limit is not specifically limited, it is preferable that it is not more than 80%. Additionally, it is preferable that the area of the boundary between one bump and the second area is 3 to 300 $\mu M^2$, more preferably 6 to 80 $\mu M^2$, and the most preferably 12 to 50 $\mu M^2$.

Providing the bumps 11 in the second area allows the light to be reflected and diffused, so that the efficiency of the outgoing light can be improved. The bumps 11 shown in FIG. 11 is formed in a dimple-shape by providing the bumps and dips so as to expose the n-type contact layer in the second area. Accordingly, the each of the bumps 11 has the same layer construction as the first area as the light-emitting area. Therefore, the bumps 11 also have the active layer part. Besides, when the active layer, which emits, of the first area and the active layer part of the bumps 11 are opposed to each other, the light emitted from the active layer of the first area can be partially absorbed by the active layer part of the bumps 11. It is considered that that part reduces the efficiency of the light utilization. On the other hand, the light from the active layer of the first area is emitted with diffusing, so that the light strikes not only the active layer part of the bumps 11 but also the clad layer part. When the light emitted from the active layer is reflected and diffused at the clad layer part, which is opposed to the active layer, of the bumps 11, the efficiency of the light utilization is improved. Consequently, when the light from the active layer of the first area is emitted while sufficiently being diffused and reflected, and the shapes of the bumps 11 are formed to allow the light to sufficiently be reflected and diffused at the clad layer part of the bumps 11, it is expected to improve the efficiency of the light utilization. It is considered that such a construction of the bumps 11 mentioned above improves the efficiency of outgoing light.

As described above, in the LED according to the present invention, the light is emitted in the horizontal direction (the direction of the side surface of the LED) can be reduced, and the light is selectively emitted upwardly (toward the observation side). Especially, in the LED having the layer with a low refractive index at least one of the layers sandwiching the active layer (preferably the upper layer or the p-side layer), the light tends to be reflected at the layer with a low refractive index. Accordingly, the light in the direction of the side surface tends to be mainly emitted. The present invention is especially effective for such a device.

Further, in actual use of the LED, the periphery of the LED is molded by molding resin of an organic resin, such as an epoxy resin and a silicon resin. The present invention can provide the LED capable of considerably reducing the deterioration of the resin even in such use. The reason is considered that the light from the active layer side is not concentrated at the resin positioned in the active layer side but is diffused by the plurality of bumps. Since especially an epoxy resin has low resistance against light, the second invention is especially effective for the LED with an epoxy resin as the molding resin. Similarly, in the device with a base of an organic resin (a nylon resin, for example), on which the LED is provided, the life of the base can be long. That is, using the LED according to the present invention can considerably reduce the deterioration of the base caused by the light emitted from the side surface of the LED. Needless to say, such an effect is more sufficient as the surface of the base is closer to the LED.

Furthermore, in the LED of this embodiment, the bumps are not formed between the n-side electrode 19 and the first area, however, the bumps can be formed between them as in embodiments 7 and 8. In the periphery of the n-side electrode 19, the intensity of the light emission is relatively high. Accordingly, providing the bumps between the n-side electrode 19 and the first area can more sufficiently improve the effect mentioned above. Moreover, a high density of the plurality of bumps can be provided in the area with relatively high intensity of the light emission, on the other hand, a low density of the plurality of bumps may be provided in the area different form that area with relatively low intensity of the light emission. Although the positions of the area with high intensity of the light emission and the area with low intensity of the light emission depend on the construction of the LED, varying the density of the plurality of bumps in consideration of intensity of the light can allow the light to effectively outgo and can perform the control of the directivity.

Embodiment 7

Figure 12:
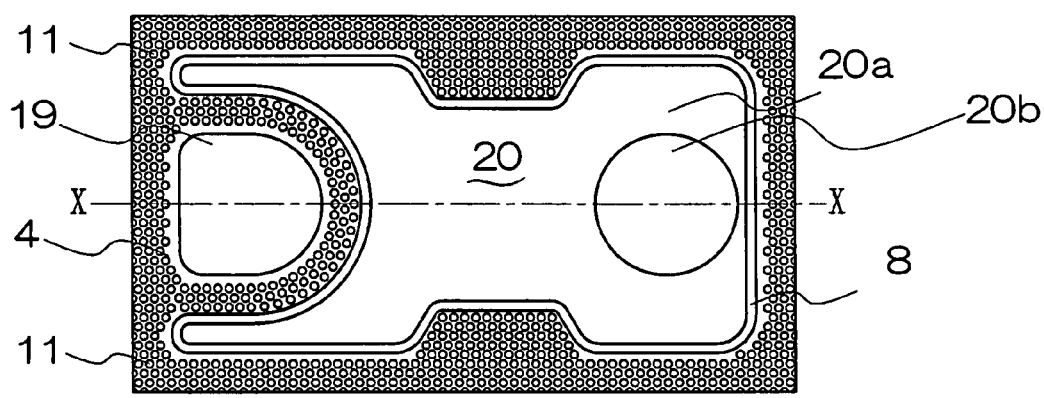
FIG. 12 is a plan view of an LED of a seventh embodiment according to the present invention from an electrode-forming-plane side.

The following description will describe an LED of the seventh embodiment with reference to FIG. 12. The LED of this embodiment has the same construction mentioned as the LED of the sixth embodiment except the shape of the laminated-layer construction of semiconductor in the first area, the shape of the p-side current diffusing member 20a corresponding to it, and the area where the bumps are formed.

In the LED of this embodiment, the first area has constricted portions, which are positioned between the n-side electrode 19 and the p-side electrode 20 in view from the electrode-forming-plane side. In addition, the plurality of bumps is formed in the constricted portions. That is, the laminated-layer construction of semiconductor provided in the first area, which is positioned between the n-side electrode and the pad member of the p-side electrode has the constricted portions in the both sides in the direction perpendicular to the line connecting the n-side electrode and the pad member of the p-side electrode, and the plurality of bumps is formed in the constricted portions. This can allow the light to be effectively emitted and to effectively go out toward the observation side.

In detail, in the LED of this embodiment, the pad member 20b of the p-side electrode and the n-side electrode 19 are positioned on the line X—X. As shown in FIG. 12, the p-side current diffusing member 20a has a shape with a longitudinal direction along the line X—X, and also the LED has a shape with a longitudinal direction along the line X—X. In addition, the current, which flows from the pad member 20b of the p-side electrode to the n-side electrode 19, mainly flows along the line X—X so that its path is the shortest. However, the inventors found that a current did not flow much in the area remote from the three points, which were the line X—X, the pad member 20b and the n-side electrode 19, so that the intensity of the light emission in that portion was low as compared with the other area. Thereby, the LED of this embodiment has made.

In consideration of the knowledge mentioned above, the constricted portions are provided in the first area which position between the n-side electrode 19 and the p-side electrode 20, and the laminated-layer construction of semiconductor corresponding to the constricted portions, which are usually light-emission areas, are removed, so that the plurality of bumps are formed in the constricted portions. Consequently, this can provide preferable light outgoing. It is considered that since the areas, which correspond to the areas with low intensity of the light emission, are actively removed, and the bumps are formed therein, the high intensity of light is directly emitted outwardly through the side surface, and then the emitted high intensity of light is varied its direction toward the observation side by the bumps. Therefore, it is possible to improve light outgoing and the directivity of the light.

Embodiment 8

Figure 13:
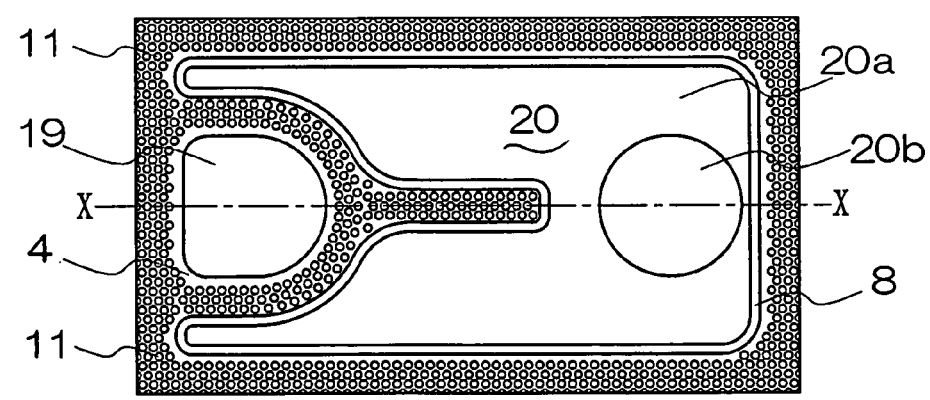
FIG. 13 is a plan view of an LED of an eighth embodiment according to the present invention from an electrode-forming-plane side.

The following description will describe an LED of the eighth embodiment with reference to FIG. 13. The LED of this embodiment has the same construction mentioned as the LED of the sixth embodiment except for the shape of the laminated-layer construction of semiconductor in the first area, the shape of the p-side current diffusing member 20a corresponding to it, and the area where the bumps are formed.

That is, the laminated-layer construction of semiconductor provided in the first area, which is positioned between the n-side electrode and the pad member of the p-side electrode, has a portion constricted from the n-side electrode along the line X—X connecting the n-side electrode and the pad member of the p-side electrode, and the plurality of bumps is formed in the constricted portion. This can improve light outgoing and the directivity of the light. As described above, current mainly flows along the line X—X. However, since a part along the line X—X is actively removed, and the plurality of bumps is formed in the removed area, it is possible to improve light outgoing and the directivity of the light. It is considered that since a part along the line X—X is actively removed, a current can be more widely diffused in the laminated-layer construction of semiconductor, and the relatively high intensity of light, which is emitted from the side surface of the laminated-layer construction of semiconductor including the active layer in the area that a part along the line X—X is removed, can effectively go out toward the observation side.

Further, the inventors found that providing the plurality of bumps in the second area as the second invention tended to improve electrostatic discharge characteristics of both the forward direction and the reverse direction. Although the reason was not obvious, probably it was considered that the reason related to the increased surface area caused by providing the plurality of bumps.

Furthermore, it is preferable that the LED of this embodiment additionally has the construction of the seventh embodiment. That is, the LED of this embodiment additionally has the constricted portions of the seventh embodiment. This can improve the effect mentioned above. The constricted portions of the embodiments 7 and 8 can be spontaneous sizes, shapes, etc.

Besides, the laminated-layer construction of semiconductor of the LED according to each embodiment is not limited to the construction mentioned above. Materials of mixed crystal and ratios of mixed crystal in each semiconductor layer, the number of the layers, orders of laminated layers, and so on can be spontaneously used by a designer, etc. Similarly, orders of laminated layers, materials, thickness, and so on, of the p-side electrode and the n-side electrode can be spontaneously used.

In addition, the LED of the embodiments 6, 7, and 8 have the outside shape of a rectangle, in which the n-side electrode and the pad member of the p-side electrode is positioned at approximately center in both ends of the longitudinal direction, in view from the electrode-forming-plane side, however, it should be appreciated that this invention is not specifically limited to this. As construction of LED other than the LED described above, the n-side electrode and the pad member of the p-side electrode can be positioned at the corners of a rectangle, which are opposed to each other, for example.

Additionally, in the embodiments 6–8, the LED with asperities, which are formed in the second area in view from the electrode-forming-plane side by the plurality of bumps, is described, however, the asperities can be formed in the second area by a plurality of dips. This can improve the efficiency of light outgoing. But this requires a complicated process. Therefore, such a construction is not preferable in view of the process. That is, a groove, which exposes the n-type contact layer, surrounding the periphery of the first area is preferably formed in order to avoid a leak, when the dips are provided in the second area. The reason is that if the groove is not formed, the first area and the second area are connected to each other. For example, if dust, etc. is attached to the cut surface, a leak is occurred, when the wafer is cut into chips. Providing the groove necessarily reduces the area where the asperities are formed. Therefore, such a construction is not preferable.

Moreover, in view from the electrode-forming-plane side, when the plurality of dips is formed in the second area, it is preferable that the number of the bumps in the second area is 100 or more, more preferably 200 or more, still more preferably 300 or more, and the most preferably 500 or more.

In the embodiments, descriptions according to the protect film is omitted, however, it is preferable that at least a part of the surface of the LED is covered by an insulating films, such as $SiO_2$, $SiN_x$. For example, an observable area from the electrode side except for the areas where the conductive members are connected to the p-side pad member and the n-side pad member can be covered by the insulating film. In this case, the asperities can be also covered.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be

What is claimed is:

1. A light-emitting diode comprising
a laminated-layer construction of semiconductor having an n-type contact layer of nitride semiconductor with an n-side electrode, a p-type contact layer of nitride semiconductor with a p-side electrode, and an active layer of nitride semiconductor,
wherein the n-side electrode and the p-side electrode are provided on the same electrode-forming-plane side,
wherein the n-type contact layer has a first area where the laminated-layer construction of semiconductor with the p-side electrode is provided, and a second area which is different from the first area as viewed from the electrode-forming-plane side,
wherein a plurality of bumps and dips is formed in the second area,
wherein a top level of the plurality of bumps and dips is positioned on the p-type contact layer side of the active layer in a cross-sectional view of the light-emitting diode,
wherein the bottom level of the plurality of bumps and dips is positioned on the n-type contact layer side of the active layer in the cross-sectional view of the light-emitting diode, and
wherein each of the bumps is formed in the shape of a trapezoid, which becomes gradually thinner in a direction toward the p-type contact layer side as viewed in a cross-sectional view of the bumps and dips.

2. The light-emitting diode according to claim 1, wherein the top level of the plurality of bumps and dips is positioned virtually as high as the p-type contact layer.

3. The light-emitting diode according to claim 1, wherein the plurality of bumps is provided at least between the first area and the n-side electrode as viewed from the electrode-forming-plane side.

4. The light-emitting diode according to claim 1, wherein the p-side electrode has a p-side current diffusing member, which is provided on the p-type contact layer, for diffusing a current supplied thereto, and a pad member, which is provided at least on a part of the p-side current diffusing member, for supplying a current to the p-side current diffusing member, and the laminated-layer construction of semiconductor provided in the first area, which is positioned between the n-side electrode and the pad member of the p-side electrode, has constricted portions in both sides in a direction perpendicular to a line connecting the n-side electrode and the pad member of the p-side electrode as viewed from the electrode-forming-plane side, and the plurality of bumps and dips is formed in the constricted portions.

5. The light-emitting diode according to claim 1, wherein the p-side electrode has a p-side current diffusing member, which is provided on the p-type contact layer, for diffusing a current supplied thereto, and a pad member, which is provided at least on a part of the p-side current diffusing member, for supplying a current to the p-side current diffusing member, and the laminated-layer construction of semiconductor provided in the first area, which is positioned between the n-side electrode and the pad member of the p-side electrode, has a portion that is constricted from the n-side electrode along a line connecting the n-side electrode and the pad member of the p-side electrode as viewed from the electrode-forming-plane side, and the plurality of bumps and dips is formed in the constricted portion.

6. The light-emitting diode according to claim 1, wherein the bottom level of the plurality of bumps and dips is positioned in the n-type contact layer as viewed in a cross-section of the light-emitting diode.

* * * * *